United States Patent
Walters

(10) Patent No.: US 6,185,830 B1
(45) Date of Patent: Feb. 13, 2001

(54) SEMICONDUCTOR WAFER FIXTURE FOR ALIGNMENT IN A GRATING EXPOSURE PROCESS

(75) Inventor: Frank Stephen Walters, Kutztown, PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/276,261

(22) Filed: Mar. 25, 1999

(51) Int. Cl.[7] .......................... G01D 21/00; B65G 49/07; G01B 1/00

(52) U.S. Cl. ............................... 33/533; 33/613; 33/645; 33/549; 414/935; 414/936; 414/941

(58) Field of Search ............................. 33/533, 549, 613, 33/645, DIG. 2; 414/935, 936, 941

(56) References Cited

U.S. PATENT DOCUMENTS

| | | | |
|---|---|---|---|
| 3,797,889 | * | 3/1974 | Wilkinson .................... 414/936 |
| 4,635,373 | * | 1/1987 | Miyazaki et al. .................. 33/645 |
| 4,655,584 | * | 4/1987 | Tanaka et al. .................... 414/936 |
| 4,717,190 | * | 1/1988 | Witherspoon ................... 414/941 |
| 4,770,600 | * | 9/1988 | Ishikawa ........................ 414/935 |
| 4,880,348 | * | 11/1989 | Baker et al. ..................... 414/936 |
| 4,887,904 | * | 12/1989 | Nakazato et al. ................ 414/936 |
| 4,944,650 | * | 7/1990 | Matsumoto ...................... 414/936 |
| 5,308,222 | * | 5/1994 | Bacchi et al. ................... 414/936 |
| 5,484,252 | * | 1/1996 | Mutoh ........................... 414/936 |
| 5,669,752 | * | 9/1997 | Moon ............................ 414/936 |
| 5,836,575 | * | 11/1998 | Robinson et al. ................ 414/935 |
| 5,860,640 | * | 1/1999 | Marohl et al. ................... 414/935 |
| 5,883,522 | * | 3/1999 | O'Boyle ......................... 414/935 |
| 5,890,269 | * | 4/1999 | Gardner et al. .................. 414/936 |
| 6,085,967 | * | 7/2000 | Grande et al. ................... 414/935 |
| 6,086,976 | * | 7/2000 | Gardner et al. .................. 414/935 |
| 6,123,502 | * | 9/2000 | Adams et al. ................... 414/941 |

OTHER PUBLICATIONS

Philippe Leclere, Yvon Renotte, Yves Lion, "Measure of the diffraction efficiency of a holographic grating created by two Gausian beams" Applied Optics, Aug. 10, 1992, vol. 31, No. 23.

L.F. Johnson, G.W. Kanmmlott, K.A. Ingersoll, "Generation of periodic surface corrugations" Applied Optics, Apr. 15, 1978 vol. 17, No. 8.

* cited by examiner

Primary Examiner—Randy W. Gibson
(74) Attorney, Agent, or Firm—Wendy W. Koba

(57) ABSTRACT

A fixture and method for providing accurate and repeatable alignment and attachment of a semiconductor wafer to a corner cube exposure fixture includes a vacuum-assisted wafer holder of rectangular shape. The wafer holder is first placed upon an L-shaped loading fixture so that a wafer may be positioned against the front surface of the holder and manipulated until the pair of wafer flats abut each leg of the L-shaped fixture. When so aligned, a vacuum is applied to secure the attachment and alignment of the wafer vis-à-vis the wafer holder. The wafer holder is thereafter inserted in a corner cube exposure fixture, where the fixture is formed to include a right-angle bracket with alignment features formed in one leg of the angle. The wafer holder also includes alignment features in its bottom surface, where these features are formed to mate with the bracket upon attachment. The proper placement and alignment of the wafer holder to the exposure fixture results in the wafer being disposed immediately adjacent to the reflective surface used to form the interference pattern on the wafer surface. The right angle in the fixture ensures that the mirror surface remains orthogonal to the wafer surface such that a uniform grating may be formed across the wafer surface.

14 Claims, 5 Drawing Sheets

SEMICONDUCTOR WAFER FIXTURE FOR ALIGNMENT IN A GRATING EXPOSURE PROCESS

TECHNICAL FIELD

The present invention relates to a semiconductor wafer fixture a method for providing alignment of a wafer during a grating exposure process and, more particularly, to a vacuum-controlled fixture and method for providing accurate and repeatable alignment of a semiconductor wafer to a reflective surface for holographic grating exposure.

BACKGROUND OF THE INVENTION

Periodically corrugated surfaces (gratings) are widely used in many different optoelectronic devices. For example, a surface grating structure can be used to provide a feedback path for distributed feedback (DFB) and distributed Bragg reflector (DBR) lasers. As an input-output coupler for selectively exciting the modes of an optical waveguide, gratings have advantages over other coupling techniques in being an integral part of the waveguide, mechanically simple, and capable of coupling into waveguides fabricated from high index materials. Additional applications include integrated narrowband filters, light deflectors, and phase matching elements.

A conventional method of forming the grating structure is referred to as a "holographic" method, in which a grating relief pattern is produced by interferometric exposure and development of photoresist on the wafer surface. The grating is then transferred to the substrate by ion-beam milling or chemical etching. Various techniques exist to generate the required interference pattern, including splitting a signal into two beams (spatially), then redirecting the two beams to the wafer surface to form the desired interference pattern. In an alternative arrangement, referred to herein as a "corner cube", the original exposure beam is directed at a mirror surface disposed at 90° with respect to the wafer. The reflections from the mirror, in combination with the beam directly impinging the wafer, will form an interference pattern on the wafer, where the angle of incidence of the exposure beam on the mirror will determine the periodicity of the grating formed on the wafer.

In many situations it is necessary to control the grating structure and periodicity as carefully as possible. For example, current DFB lasers utilize a grating a structure with dimensions on the order of 0.1 $\mu$m lines and spaces. Small angular errors when manufacturing the grating by UV exposure can have drastic effects on the performance and manufacturing of the DFB lasers. In the "corner cube" exposure arrangement, such angular errors have been attributed to misalignment of the wafer with the reflective surface, thus varying the grating exposed on the wafer surface. In particular, a misalignment may result in the grating varying in periodicity across the surface of the wafer. The repeatability of the wafer-to-mirror alignment is also problematic, resulting in the gratings being slightly different on each wafer as a number of wafers are processed in succession.

SUMMARY OF THE INVENTION

The limitations with the corner cube exposure fixture are addressed by the present invention, which relates to a semiconductor wafer fixture and method for providing alignment of a wafer during a grating exposure process and, more particularly, to a vacuum-controlled fixture and method for providing accurate and repeatable alignment of a semiconductor wafer to a reflective surface for holographic grating exposure.

In accordance with the present invention, a semiconductor wafer is positioned against a vacuum opening in a wafer holder, where the holder is removably attached to a loading fixture. The holder and loading fixture are attached such that a loaded wafer's major and minor flats are butted against flat surfaces of the loading fixture. The wafer may be adjusted until its flats are in intimate contact with these adjacent surfaces of the loading fixture. Once the wafer is in place, a vacuum is applied to draw the wafer against the holder. The holder is then removed from the loading fixture, and attached to a corner cube exposure fixture, where the holder is positioned at an angle of 90° with respect to a mirror surface of the corner cube exposure fixture. The application of the vacuum to the holder results in maintaining the desired position of the wafer with respect to the holder; that is, the major and minor flats of the wafer are coincident with the respective edges of the holder. The portion of the corner cube exposure fixture beyond the mirror surface is formed to include alignment features that mate with like alignment features formed on the wafer holder. When the holder is therefore attached to and aligned with the mirror surface, the wafer flat will automatically align with the mirror surface. The self-aligned nature of the arrangement of the present invention thus results in the ability to expose uniform grating structures across the surface of the wafer, as well as expose gratings of the same periodicity on each subsequent wafer being processed.

In a preferred embodiment of the present invention, the alignment features comprise a mating set of pins and apertures, where a same set of alignment features may be used to attach the holder to the loading fixture as well as to align the holder to the corner cube exposure fixture. A second set of alignment features may be formed on an orthogonal surface of the holder and mated with similar features on the corner cube exposure fixture to ensure accurate alignment.

In an alternative embodiment, the holder may be further formed to include a screw-down attachment for further securing the wafer holder to the corner cube exposure fixture. This additional attachment of the holder to the exposure fixture further prevents relative movement of the holder with respect to the exposure fixture which may occur, for example, as the fixture is rotated to change the exposure beam's angle of incidence.

Other and further features and embodiments of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
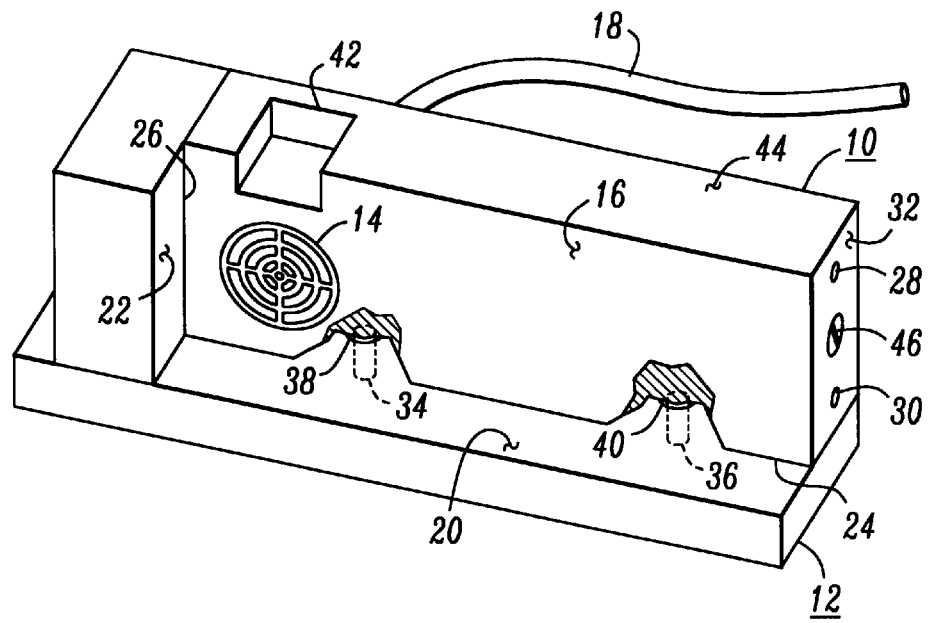
FIG. 1 contains an illustration of an exemplary wafer holder in position with an exemplary loading fixture, showing in particular the vacuum opening on the holder for securing a wafer to the holder.

An exemplary vacuum-assisted rectangular wafer holder 10, formed in accordance with the present invention, is shown in FIG. 1 as (removably) attached to an exemplary loading fixture 12. Rectangular holder 10 is formed to include a vacuum opening 14 in a front surface 16, where vacuum opening 14 is coupled to a vacuum source (not shown), via a vacuum connection 18 attached to holder 10. Loading fixture 12 is generally formed as an "L-shaped" fixture including a lower surface 20 and a side surface 22, with side surface 22 formed as perpendicular to lower surface 20. Rectangular holder 10 is positioned with respect to loading fixture 12 such that a first side surface 24 of holder 10 rests against lower surface 20 of fixture 12 and a top surface 26 of holder 10 rests against side surface 22 of fixture 12. As will be discussed below in association with FIG. 2, this positioning of rectangular wafer holder 10 with respect to fixture 12 allows for a semiconductor wafer (not shown) to be repeatably aligned with holder 10.

Referring back to FIG. 1, holder 10 is shown as also including a set of alignment features, where these features will be used hereinafter when holder 10 is attached to an exemplary corner cube exposure fixture (as discussed below in association with FIGS. 5 and 6). In particular, rectangular wafer holder 10 includes a first set of alignment features 28, 30 formed in a bottom surface 32 of holder 10, where in this particular embodiment alignment features 28,30 comprise a pair of apertures. A second set of alignment features 34,36 are formed in side surface 24 and mate with a set of alignment features 38,40 formed in lower surface 20 of loading fixture 12. In the embodiment illustrated in FIG. 1, second set of alignment features 34,36 are shown as pins that mate with alignment apertures 38,40 of fixture 12. Holder 10 may also include a detent 42, formed in a side surface 44, to aid in the placement and adjustment of a semiconductor wafer against front surface 16 of holder 10. A threaded attachment member 46 (optional) is illustrated as formed in bottom surface 32 of holder 10 and may be used, as discussed below, to secure the attachment of holder 10 to a corner cube exposure fixture.

Figure 2:
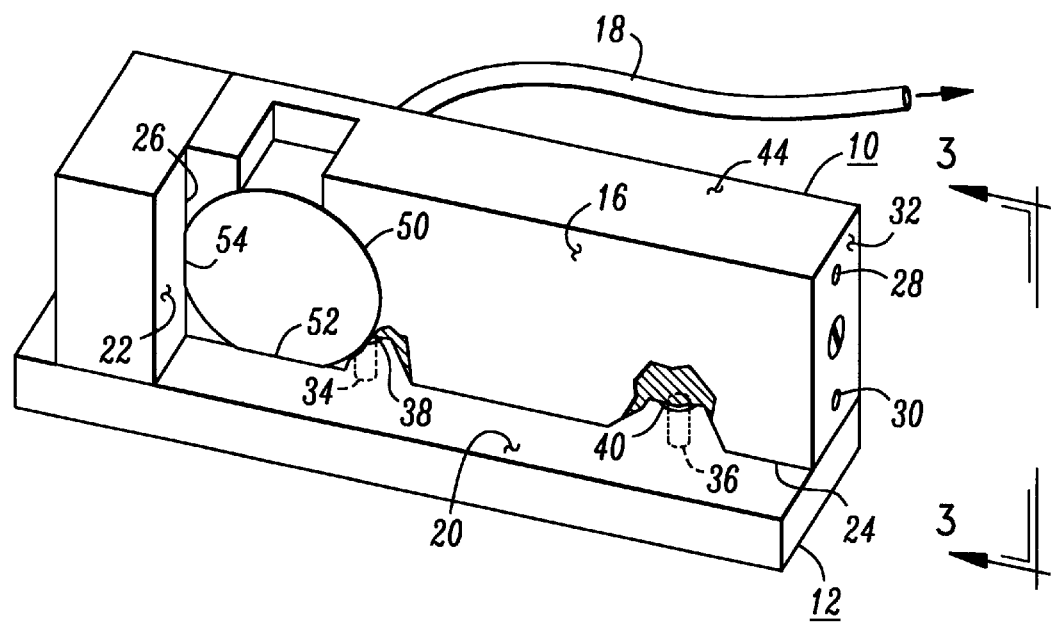
FIG. 2 is a view of the arrangement of FIG. 1, with a semiconductor secured, via the vacuum opening to the holder, and aligned with the respective surfaces of the loading fixture.

FIG. 2 illustrates the apparatus as described above in association with FIG. 1, with a semiconductor wafer 50 disposed against front surface 16 of holder 10. In accordance with the present invention, wafer 50 is positioned such that its major flat 52 rests against lower surface 20 of loading fixture 12 and its minor flat 54 abuts side surface 22 of loading fixture 12. The inclusion of detent 42 in holder 10 allows for wafer 50 to be manipulated (by using a pair of tweezers, for example) until both flats 52 and 54 are accurately positioned. Once positioned, therefore, wafer flats 52,54 will be similarly aligned with the associated edges of holder 10. After wafer 50 has been manipulated into place, a vacuum may be turned on so that vacuum opening 14 (underneath wafer 50) will pull wafer 50 against front surface 16 of holder 10, securing wafer 50 in place.

In accordance with the teachings of the present invention, the utilization of surfaces 20,22 of loading fixture 12 as alignment surfaces ensures that each wafer subsequently attached to holder 10 will always align with the edges of holder 10, resulting (as discussed below) in repeatable accuracy of the following grating exposure.

Figure 3:
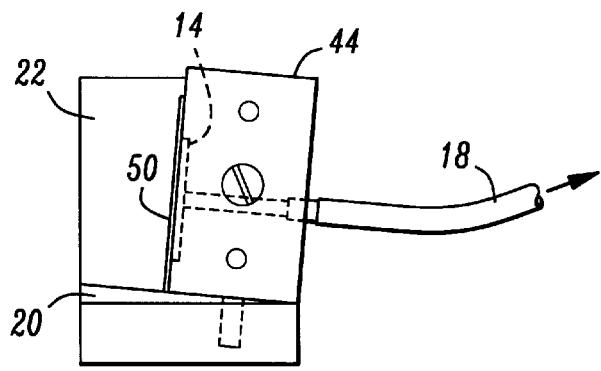
FIG. 3 is a side view the arrangement of FIG. 2, taken along line 3—3, showing in particular the tilt of the holder with respect to the fixture so as to aid in the securing of the wafer to the holder.

In a preferred embodiment of the present invention, lower surface 20 of loading fixture 12 is angled downward from front to back so that wafer 50 will naturally rest against front surface 16 of holder 10 prior to the application of a vacuum. FIG. 3 contains a cut-away side view of the arrangement of FIG. 2, illustrating in particular the front-to-back tilt of lower surface 20.

Figure 4:
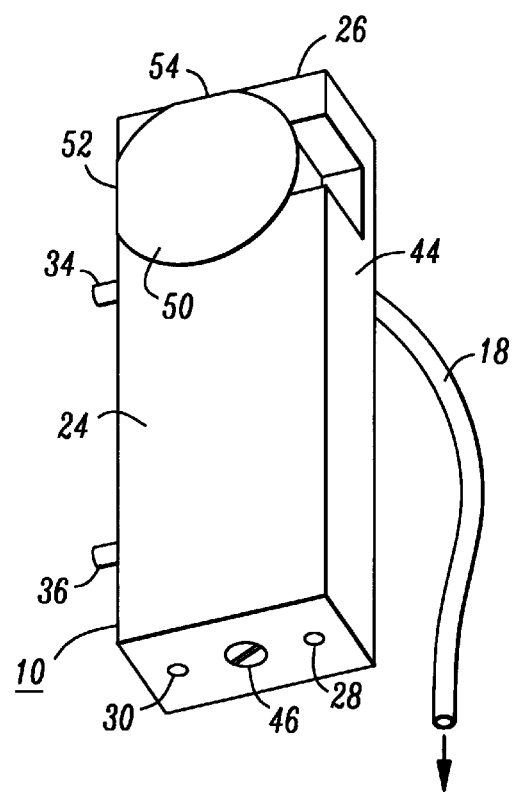
FIG. 4 is a view of a free-standing wafer holder, subsequent to its removal from the loading fixture and prior to its attachment to a corner cube exposure fixture.

Once wafer 50 has been properly aligned against surfaces 20,22 of loading fixture 12 (and the vacuum applied to secure wafer 50 in place), holder 10 is removed from loading fixture 12. FIG. 4 illustrates holder 10 upon removal from loading fixture 12. Particularly evident in this view is the alignment of major flat 52 of wafer 50 with side surface 24 of holder 10. As will be discussed below, this alignment is critical to obtaining accurate alignment of wafer 50 with the reflective surface used to form the holographic grating pattern on the wafer surface. During the process of removing holder 10 from loading fixture 12 and thereafter attaching holder 10 to a corner cube exposure fixture, a vacuum force is maintained to ensure that wafer 50 remains securely attached to holder 10.

Figure 5:
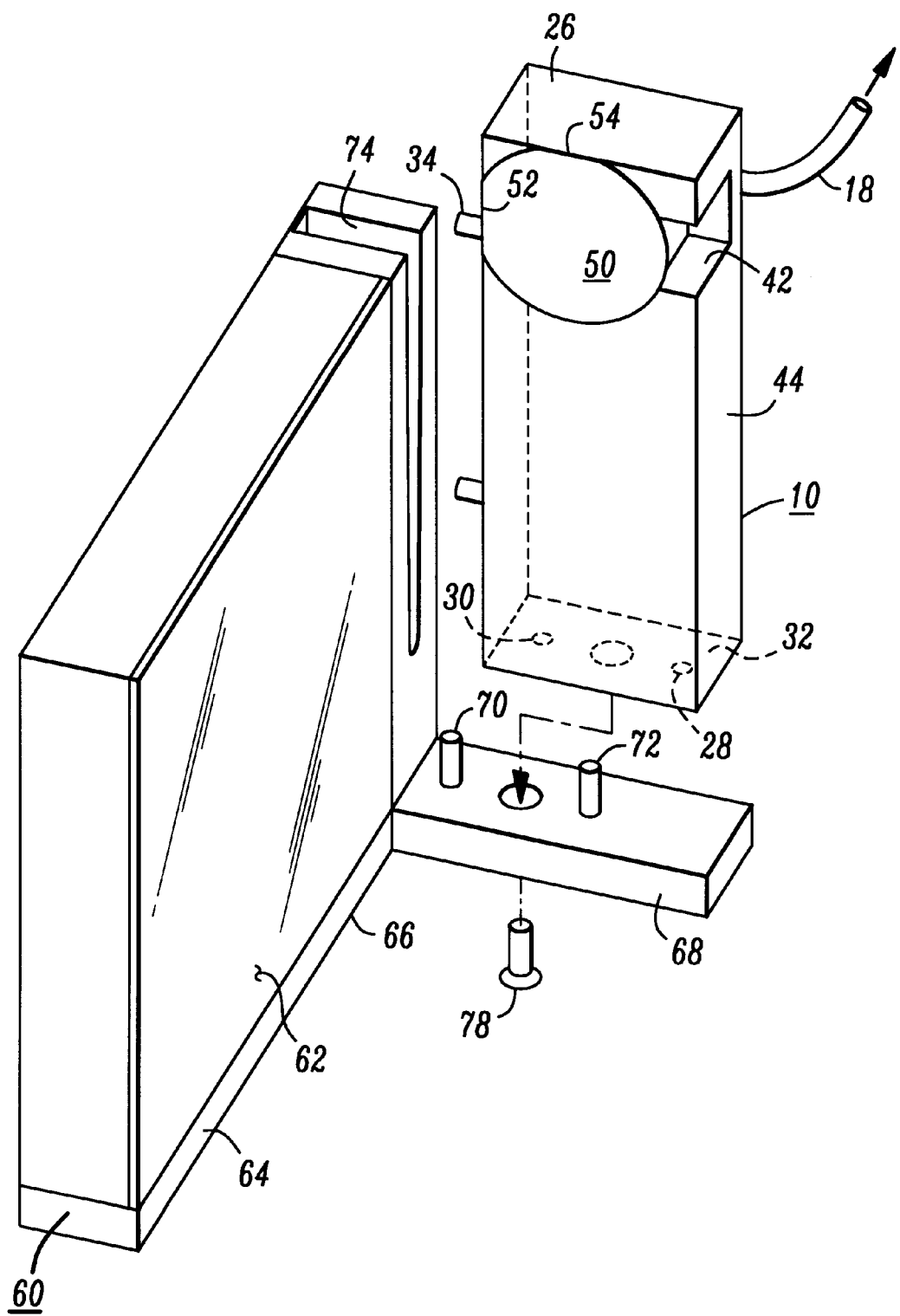
FIG. 5 illustrates the attachment of the wafer holder of FIG. 4 to an exemplary corner cube exposure fixture, the arrows indicating the direction of attachment.
Figure 6:
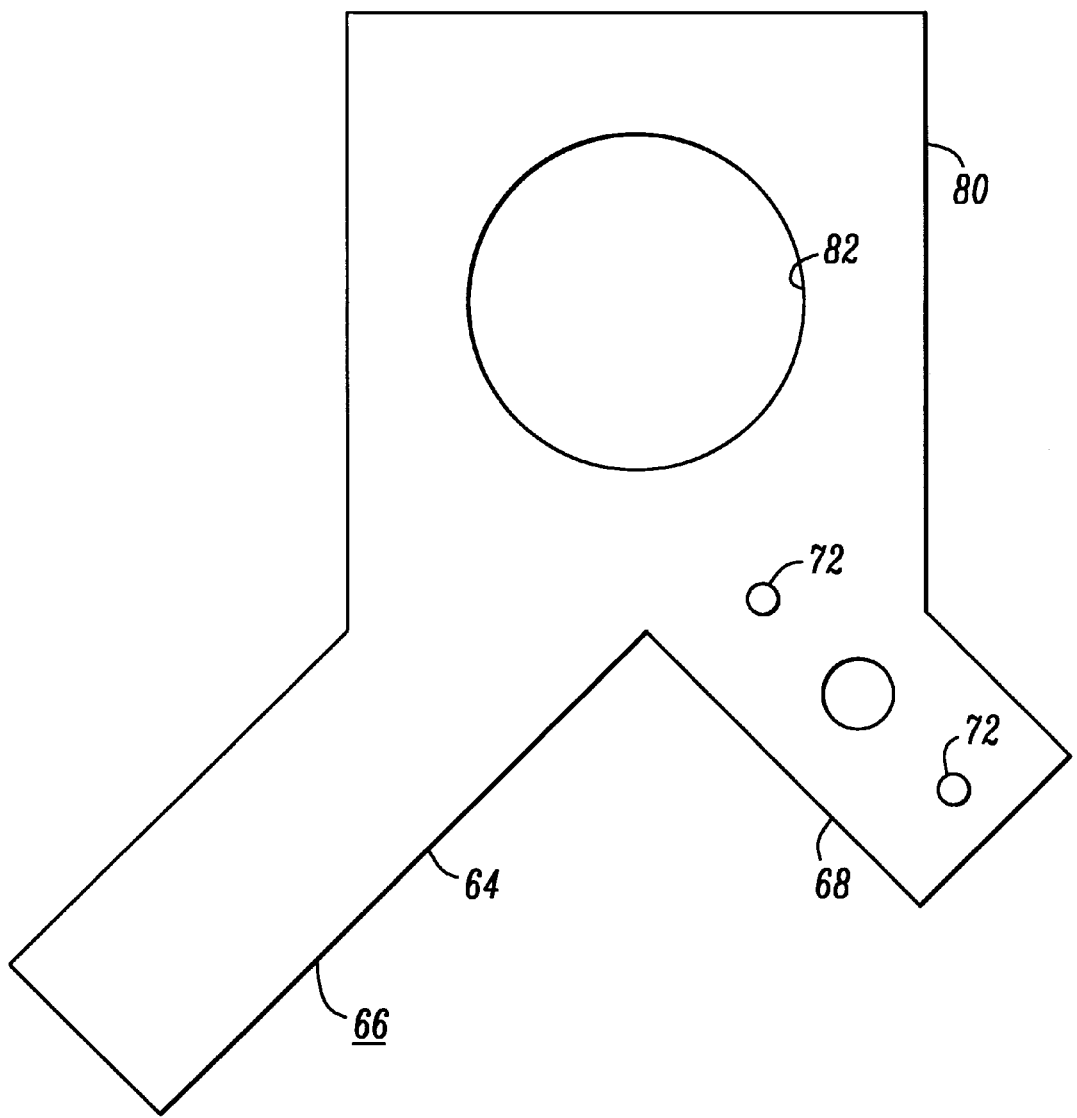
FIG. 6 is a bottom view of an exemplary corner cube exposure fixture.

FIG. 5 illustrates the process of attaching holder 10 to an exemplary corner cube exposure fixture 60. As shown, exposure fixture 60 includes a mirror surface 62 formed on a first leg 64 of a right-angle fixture 66. The remaining leg 68 of right-angle fixture 66 is formed to include a set of alignment features 70,72 that mate with alignment features 30 and 28, respectively, of holder 10 upon attachment (as indicated by the arrows in FIG. 5). First leg 64 of fixture 66 further includes a channel portion 74 disposed next to mirror surface 62. As shown, when holder 10 is being attached to exposure fixture 60, alignment features 34,36 of holder 10 will be inserted into channel portion 74, sliding down along channel 74 as bottom surface 32 of holder 10 comes into contact with second leg 68 of right-angle fixture 66. Second leg 68 may be formed to include a threaded aperture 76 that aligns with (optional) threaded aperture 46 of holder 10. A threaded screw 78 is then inserted through the underside of second leg 68 to affix holder 10 to second leg 68. As discussed above, this additional screw attachment is considered to be optional, further ensuring that holder 10 remains in position with respect to exposure fixture 60.

Figure 7:
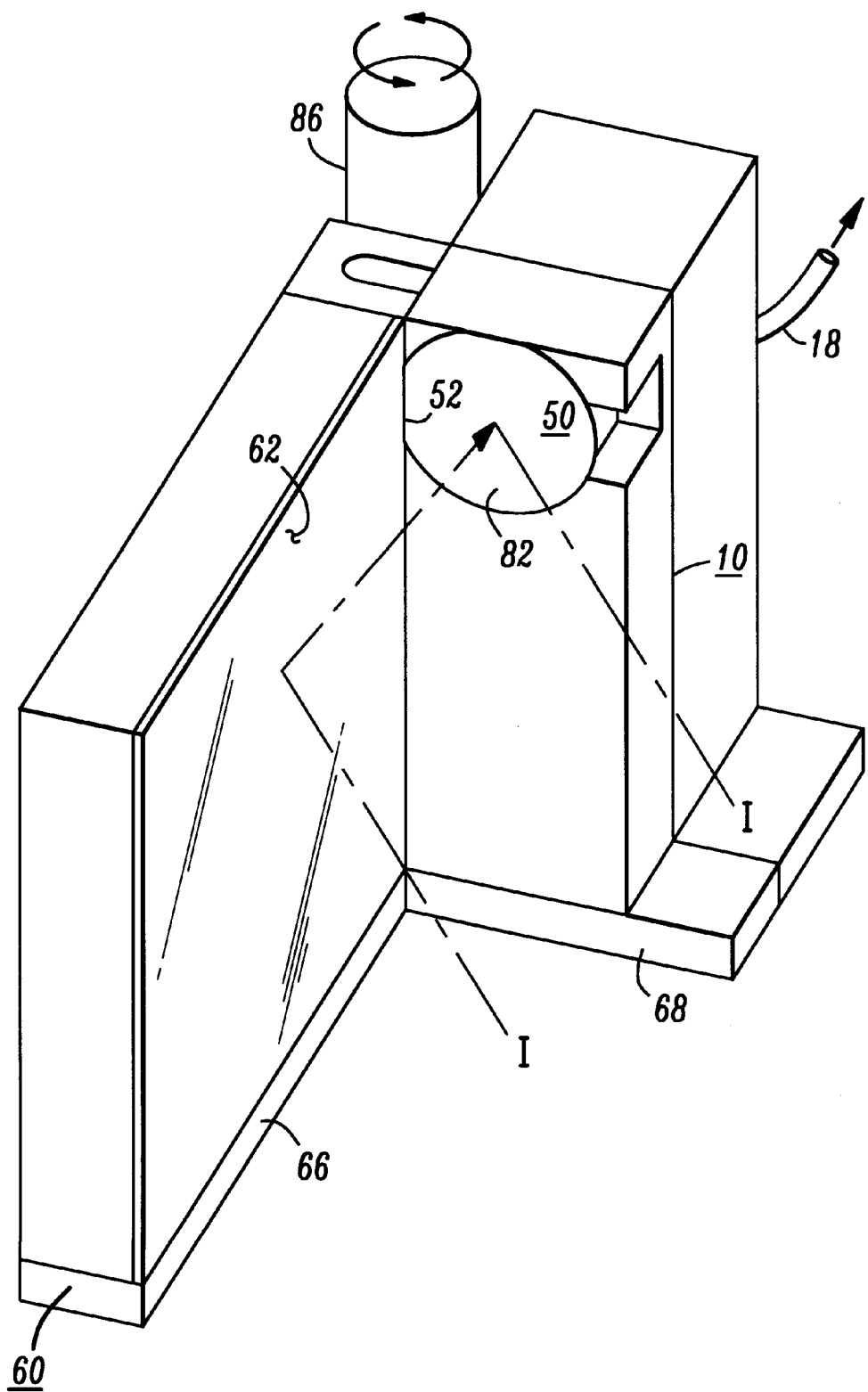
FIG. 7 contains an illustration of an exemplary vacuum-assisted wafer holder attached to and aligned with an exemplary corner cube exposure fixture, the illustration including a central mounted spindle for modifying the angular location of the arrangement with respect to an incident exposure beam, the arrows above the spindle indicating the direction of movement of the arrangement.

In the utilization of a corner cube exposure fixture to expose gratings of different periodicity on a wafer surface, it is desirable to modify the position of the fixture with respect to the exposure light source so as to change the angle of incidence of the exposure beam on the mirror surface. In a preferred embodiment, corner cube exposure fixture is rotated with respect to a fixed light source to modify the angle of incidence. In this arrangement, corner cube exposure fixture 60 is mounted on a central spindle and rotated about a central axis formed by the coincidence of wafer holder 10 and exposure fixture 60. FIG. 6 contains a bottom view of right-angle fixture 66, formed to include a rear portion 80 with a rear aperture 82. In operation, as shown in FIG. 7, a spindle 86 is inserted over aperture 82 and used to rotate the final structure to change the angle of incidence of an exposure beam I is also shown in this illustration.

In accordance with the present invention, the location of wafer 50 with respect to holder 10 results in flat 52 of wafer 50 being positioned directly against, and at an angle of 90° to, mirror surface 62. Advantageously, the positioning of wafer 50 with respect to mirror surface 62 can be controlled such that the center line of wafer 50 will coincide with the center line of mirror surface 62. Thus, any possible perturbations in the exposed grating due to mirror "edge effects" are essentially eliminated by using the central, more planar area of the mirror to provide the necessary reflections to form the grating interference pattern. Additionally, the alignment arrangement of the present invention is repeatable from wafer to wafer, as each wafer is accurately positioned using loading fixture 12, as discussed above. Since each wafer is in essentially identical alignment, the gratings exposed by the interference of reflected beam I with that portion of incident beam I directly impinging wafer 50 will result in essentially identical gratings (denoted by lines 82) being exposed on each wafer so processed. Advantageously, the use of a vacuum to hold wafer 50 against holder 10 with a uniform force across the wafer surface results in an essentially uniform spacing of the gratings across the surface of the wafer.

It is to be understood that there exist various modifications to the above-described arrangement that are considered to fall within the spirit and scope of the present invention. For example, the alignment features may comprise more than a single pair of alignment features, and the use of pins and apertures may be reversed. Additionally, vacuum port 18 may be disposed at locations other that the back surface of holder 10. These and other modifications are all considered to be within the scope of the present invention as defined by the claims appended hereto.

What is claimed is:

1. An arrangement for mounting and aligning a semiconductor wafer with a corner cube exposure fixture, the corner cube exposure fixture including a mirror surface for use in forming holographic grating patterns on a semiconductor wafer surface, the arrangement comprising a rectangular wafer holder including a vacuum aperture through a front surface thereof for securing a semiconductor wafer thereto, said holder further comprising a plurality of alignment features formed in a bottom surface and a side surface thereof, said vacuum aperture disposed such that upon attachment of a wafer to said wafer holder, the wafer flats will be adjacent to a top surface and said side surface of said wafer holder; and an L-shaped loading fixture defined as including a lower surface and a perpendicular side surface, said loading fixture having suitable dimensions with respect to said rectangular wafer holder such that said wafer holder side surface rests against said loading fixture lower surface and said wafer holder top surface rests against said loading fixture side surface, wherein upon placement of a wafer against said wafer holder top surface, a first flat surface of said wafer abuts said loading fixture lower surface and a second flat surface of said wafer abuts said loading fixture side surface.

2. An arrangement as defined in claim 1 wherein the arrangement further comprises a corner cube exposure arrangement comprising a right-angle fixture defined by a first leg and a second leg, said fixture including a mirror surface formed on the first leg and a plurality of alignment features formed on the second leg of said right-angle fixture, said plurality of alignment features for mating with the alignment features formed on the bottom surface of the wafer holder upon mating of said wafer holder with said corner cube exposure arrangement, said corner cube exposure arrangement further comprising an alignment channel disposed adjacent to said mirror surface for communicating with the plurality of alignment features formed on the side surface of said wafer holder upon mating of said wafer holder with said corner cube exposure arrangement.

3. An arrangement as defined in claim 2 wherein the wafer holder further comprises a threaded aperture included in the bottom surface thereof and the right-angle fixture second leg comprises a threaded aperture for aligning with said wafer holder threaded aperture, said arrangement further comprising a screw member for engaging both threaded apertures and attaching said wafer holder to said right-angle fixture.

4. An arrangement as defined in claim 1 wherein the wafer holder further comprises a detent formed in a side surface to assist in the manipulation of a semiconductor wafer with respect to said holder.

5. An arrangement as defined in claim 1 wherein the loading fixture lower surface is angled so as to tilt downward from front to back, said tilt for assisting in the placement of a wafer against the wafer holder front surface.

6. An arrangement as defined in claim 1 wherein the wafer holder includes a vacuum port disposed through a rear surface thereof, said vacuum port in contact with the vacuum aperture on the front surface thereof such that upon the application of a vacuum force, a semiconductor wafer disposed over said vacuum aperture will remain attached to said wafer holder front surface.

7. An arrangement as defined in claim 2 wherein the wafer holder bottom surface alignment features comprise a plurality of apertures and the corner cube exposure fixture plurality of alignment features comprise a plurality of pins such that said pins mate with said apertures upon attachment of said wafer holder to said corner cube exposure fixture.

8. An arrangement as defined in claim 7 wherein the plurality of wafer holder bottom surface alignment apertures comprise a pair of alignment apertures and the corner cube exposure fixture plurality of alignment features comprise a pair of alignment pins.

9. An arrangement as defined in claim 2 wherein the wafer holder side surface alignment features comprise a plurality of alignment pins for engagement with the corner cube exposure fixture alignment channel.

10. An arrangement as defined in claim 9 wherein the plurality of alignment pins comprises a pair of alignment pins.

11. A method of aligning a semiconductor to a corner cube exposure fixture for use in a holographic grating exposure process, the method comprising the steps of:

a) providing a rectangular wafer holder including a vacuum aperture through a front surface thereof, said holder further comprising a plurality of alignment features formed in a bottom surface and a side surface thereof;

b) providing an L-shaped loading fixture defined as including a lower surface and a perpendicular side surface;

c) placing the rectangular wafer holder in relationship with said L-shaped loading fixture such that the wafer holder side surface is contiguous with the loading fixture lower surface and a top surface of the wafer holder is contiguous with the load fixture perpendicular side surface;

d) positioning a semiconductor wafer over the wafer holder front surface so as to cover the vacuum aperture, said semiconductor wafer including a major flat and a minor flat, the major and minor flats formed to be orthogonal to one another;

e) adjusting the position of said semiconductor wafer until the major flat is contiguous with the loading fixture lower surface and the minor flat is contiguous with the loading fixture perpendicular side surface; and f) applying a vacuum to said wafer holder to maintain the semiconductor wafer in the aligned position achieved in step e).

12. The method of aligning as defined in claim 11 wherein the method comprises the further steps of:

g) providing a corner cube exposure arrangement comprising a right-angle fixture defined by a first leg and a second leg, said fixture including a mirror surface formed on the first leg and a plurality of alignment features formed on the second leg of said right-angle fixture;

h) removing the wafer holder from the loading fixture and attaching said wafer holder to said corner cube exposure fixture such that the bottom surface of said wafer holder is contiguous with the second leg of the right-angle fixture and the side surface of said wafer holder is contiguous with the mirror surface of said right-angle fixture.

13. The method of aligning as defined in claim 12 wherein the wafer holder further comprises a first set of alignment features formed in the bottom surface thereof and a second set of alignment features formed in the side surface thereof, and the corner cube exposure arrangement further comprises a first set of alignment features formed in the second leg thereof and a second set of alignment features formed contiguous with the mirror surface, the method further comprising the step of:

i) adjusting the wafer holder with respect to the corner cube exposure arrangement such that the first set of wafer holder alignment features mates with the first set of corner cube exposure arrangement alignment features and the second set of wafer holder alignment features mates with the second set of corner cube exposure arrangement alignment features.

14. The method of aligning as defined in claim 13 wherein in performing step i), the corner cube second set of alignment features comprises an alignment channel and the adjusting includes sliding the wafer holder into position with respect to the corner cube alignment arrangement until the first set of wafer holder alignment features comes into intimate contact with the corner cube exposure arrangement first set of alignment features.

* * * * *